(12) United States Patent
Doraisamy

(10) Patent No.: US 8,080,901 B2
(45) Date of Patent: Dec. 20, 2011

(54) MULTI-SOURCE INTEGRATED ELECTRICITY GENERATION FROM NOVEL SMART ROADS AND PAVEMENTS

(76) Inventor: Loganathan Doraisamy, San Diego, CA (US)

( * ) Notice: Subject to any disclaimer, the term of this patent is extended or adjusted under 35 U.S.C. 154(b) by 0 days.

(21) Appl. No.: 12/724,225

(22) Filed: Mar. 15, 2010

(65) Prior Publication Data

US 2010/0231046 A1 Sep. 16, 2010

Related U.S. Application Data

(60) Provisional application No. 61/160,341, filed on Mar. 16, 2009.

(51) Int. Cl.
*H02J 7/34* (2006.01)
(52) U.S. Cl. .............. 307/72; 307/42; 307/147; 290/1 R
(58) Field of Classification Search .............. 307/72–75, 307/42, 147; 310/306, 311; 290/1 R
See application file for complete search history.

(56) References Cited

U.S. PATENT DOCUMENTS

| | | | | |
|---|---|---|---|---|
| 7,495,351 | B2 * | 2/2009 | Fein et al. | 290/1 R |
| 7,550,860 | B1 * | 6/2009 | Blumenthal | 290/1 R |
| 2005/0073150 | A1 * | 4/2005 | Patel et al. | 290/1 R |
| 2005/0127677 | A1 * | 6/2005 | Luttrull | 290/1 R |
| 2007/0228890 | A1 * | 10/2007 | Zanella et al. | 310/339 |
| 2008/0083139 | A1 * | 4/2008 | Mullen | 36/136 |
| 2009/0195077 | A1 * | 8/2009 | Blumenthal | 307/72 |
| 2009/0195226 | A1 * | 8/2009 | Abramovich et al. | 322/2 R |
| 2010/0109473 | A1 * | 5/2010 | Peterson | 310/306 |
| 2010/0133836 | A1 * | 6/2010 | Horlacher et al. | 290/52 |

* cited by examiner

*Primary Examiner* — Fritz M Fleming
(74) *Attorney, Agent, or Firm* — Steven W. Webb

(57) ABSTRACT

An electricity generation system that uses smart pavement is presented, which pavement is comprised of materials that use solar radiation, piezo electricity, and temperature differentials within the road surface itself to create electric power. The pavement is multi-level, modular in construction, and comprised of photo-piezo-thermo-voltaic (PPTV) materials and physical means to capture the motion of passing vehicles as energy.

4 Claims, 4 Drawing Sheets

MULTI-SOURCE INTEGRATED ELECTRICITY GENERATION FROM NOVEL SMART ROADS AND PAVEMENTS

RELATED APPLICATIONS

This application claims the benefit of Provisional Application 61/160,341, filed Mar. 16, 2009.

FIELD OF THE INVENTION

This invention relates to the fields of automated power generation, green energy materials, and clean energy generation.

BACKGROUND OF THE INVENTION

The present invention presents methods and means of generating electricity from roadways and pavements using multiple sources of wasted power. One of the major aspects of this invention is the design and development of new materials and their integrated material structures called Photo-Piezo-Thermo-Voltaics (PPTV) as their material structures required for more efficient harvesting of multiple sources of wasted power on the roadways and pavements. Applications of these PPTV materials are not only applied to roadways and pavements but also proposed for current and future energy harvesting needs using multiple sources namely light, heat, pressure, mechanical, wind, ocean waves, and other forms of energy.

The invention enables almost steady electricity generation throughout the day and night, as it uses mechanical energy and pressure exerted on the roadways by the vehicles, in addition to the solar energy wasted on the roadways and pavements, and also from the heat generated from various energy sources. This invention relies on running vehicles and hence is more efficient during peak traffic hours, and also relies on sun light and hence is more efficient at peak sunlight hours.

The peak value of solar energy falling on the earth's surface is approximately 1 k Watt per square meter. At the current efficiency levels, photovoltaic (PV) solar cells can generate 150 Watts per square meter in direct sunlight which is about 15W per square foot. Adding other forms of energy wasted on the roadways and pavements to the solar energy it is possible to generate enormous amount of electricity on the roadways and pavements which can be used to light nearby areas, to power the electric cars of the future and to build smart roads that function with this harvested and stored energy.

Design and Fabrication of new innovative hybrid materials and design of their material structures called Photo-Piezo-Thermo-Voltaics (PPTV), which are also subject matter of this invention, multiple sources of energy can be harvested efficiently. This invention is also includes a novel design of the integrated power generation system that has number of capabilities to collect, add, convert, store, transport, and use the electricity generated in the roads and pavements.

The inventor estimates that this integrated approach will result in a highly efficient energy harvesting system that will generate 3 to 4 times more electricity per square foot than conventional solar panels. This is possible due to several energy sources namely, solar, mechanical, pressure, heat, thermal gradients and light instead of one. The novel PPTV materials and their structures, are crucial in enabling the integration of these energy sources.

Simple calculations performed by the inventor shows that, using less than 10 percent of the roadways in the US, it would be possible to generate the electricity required for the entire United States of America, including running large number of battery-operated vehicles and providing power for smart roadways of the future. The vehicle batteries will be charged using the harvested electricity on roadways and by building battery storage and replacement stations alongside the roadways, another feature of this invention.

SUMMARY OF THE INVENTION

The present invention is a multi-source energy harvesting method for roadways and pavements developed to use generate electricity from multiple sources of energy. The present invention is different from the prior art in the sense that this method uses more than one source of wasted energy available on the roadways. The electricity will be generated from one, two, three or all of the following available sources of the energy on the roads and pavements depending on the availability of these sources:

Solar energy and heat generated by the sunlight on the roadways and pavements during day time is converted into electricity via Photo-Electric effect using the inventor's design and fabrication of Photo-Piezo-Thermo-Voltaics (PPTV) materials and their integrated structures. The photovoltaic and thermoelectric nature of the PPTV materials that are designed using novel semiconductor based materials to convert solar light and heat into electrical energy. A modified design of the semiconductor junctions made within these PPTV materials converts both light energy and thermal energy generated by the Sun into electricity at the same time. The same PPTVs also converts other forms of light into electricity in the night.

Pressure and vibrations generated by the running vehicles is converted in to electricity via the Piezo-Electric effect. The piezo-electric layer design which is also called the substrate layer of the PPTV materials structures is designed to perform this task. Novel piezo-electric ceramic material is part of the design of PPTV material structures which is integrated with the another novel photo-thermo semiconductor material for this purpose. The ceramic layer acts as substrate layer for semiconductor layer. This is radically different from the conventional solar materials. The new design and fabrication process can also use the conventional solar cells or solar films. But the conventional solar materials can only convert light into electricity, whereas the proposed PPTV design and structures can convert heat, light and pressure energies into electricity. The design and fabrication of these PPTV materials are flexible enough to make them in different sizes, shapes, different number of layers and so on. In a modified design of the PPTV structure a single layer is capable of converting light, heat and pressure into electricity. This is done by choosing the composition of the materials which has Photo-Electric, thermo-electric and Piezo-electric properties in one structure by depositing them together.

Additionally heat generated by the vehicles and sunlight on the surface of the road creates temperature gradients between the layers of the roadways and pavements which will also generate electricity by Thermo-electric effect using thermocouple junctions embedded in the same PPTV structures.

Effect of vehicle tire rotations on the surface on the roads (mechanical force and pressurized air) via Electro-mechanical methods using the dynamo effect. This is an optional embodiment and is employed only under special situations where the consumed energy is significant due to frictional forces and vehiclular traffic is significant enough.

The light from automobile headlights is also collected using the same PPTV structures via the Photo-Electric effect.

The inventors design of the PPTV materials is very flexible and modular and hence capable of harvesting energy from multiple sources mentioned above or fewer sources depending on the availability and quantity of the sources of wasted energy. The existing energy harvesting methods for buildings, roadways and pavements in the prior art typically use conventional solar panels installed on the roadside lamp posts, home roof-tops, windows, tents and so on.

The central part of this invention is the design and development of new type of smart material structures called Photo-Piezo-Thermo-Voltaics (PPTV). These materials are designed in more than one form. Depending on the location and type of pavements and roadways, the material structure design is flexible. The general form of the material structure has a multi-layer structure wherein each layer will play specific roles. Additionally protective layers and layers to transport the generated power into the main electric grid are incorporated in the design as shown in the diagram. The PPTV materials are not limited to roadways and pavements. These PPTV materials has potential applications in existing and future power harvesting methods wherever more than one source of power is available. Some examples include wind energy, ocean energy, hydro energy, geothermal and other sources can be combined with solar light and heat by design changes to the PPTV material structures.

PPTV material has a top layer which is light sensitive and efficiently converts light into electricity. The same layer has semiconductor junctions capable of converting heat into electricity. The next layer which acts as substrate to the top layer is Piezo-Electric ceramic. In an alternate embodiment, the top layer has embedded rotors and thermo-couple based thermo-electric generators.

This integrated power generation method will enable multi-source electricity generation and is designed specifically for roadways and pavements. A model showing a block of this Multi-Source Electricity Generating system that describes both aspects of the invention is shown in FIG. 1.

The integrated PPTV material structure will act as building blocks for future roads or will be modified as replacement layers to existing roads.

The new roads built using the invention can be called power roads, "smart roads", or "Green Roads". Multiple layers on these "smart roads" will also do the following tasks to meet next generation requirements that include but not limited to:
Enabling multi-source electricity generation.
Traction to enable vehicular transport. The smart multi-source energy harvesting structures will have a transparent protective layer for the PPTV materials. Using the rotors which is optional that generates energy will also help the traction, reduce friction and also reduce damage to the PPTV layers.
Protection from damage and wear and tear to the materials from the running vehicles and environmental factors.
Monitoring of wear and tear of the roads, bridges and pavements using sensors for structural health monitoring. The embedded design is one variation of the design and adopted as needed.
Effective rain water collection, water channeling to subsurface or to water storage locations using suitable surface design/pattern and gutters.
Power cables for integrated electricity collection, transport, and the storage of the electricity, is part of the integrated smart road system.
Electricity storage options using small batteries and electric grids available for signs and traffic lights. This is also part of the current design and will be used as needed.
Power conversion systems from one kind/type of electricity to other depending on the usage, storage and charging requirements and final device applications and transportation.

DETAILED SPECIFICATION

The invention is comprised of a new material design and fabrication and a method of use. The new material is a composite of several layers, each designed to perform a different energy-collecting function.

Direct sunlight falling on the roads and pavements (during the day time) and lights from the vehicle headlights in the nights is used to generate electricity using flexible material structures, called Photo-Piezo-Thermo-Voltaics (PPTV). PPTVs are hybrid materials and their structures that can generate electricity from sunlight, heat and also from pressure and vibrations.

Figure 1:
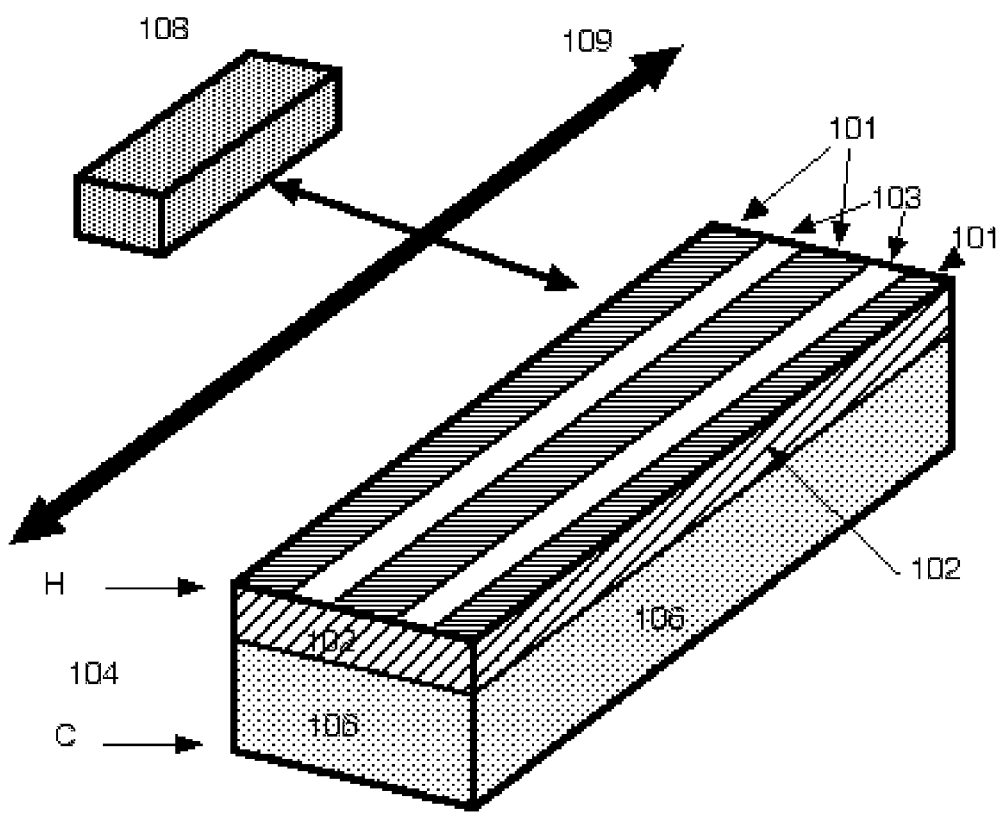
FIG. 1. Overview of the invention
FIG. 2. Solar power generator with protective layer
FIG. 3. Cross section of layered PPV structure
FIG. 4. Section of tiny rotors in invention top layer
FIG. 5. Thermo-electric power harvesting
FIG. 6. Cross-section of bottom layer
Figure 2:
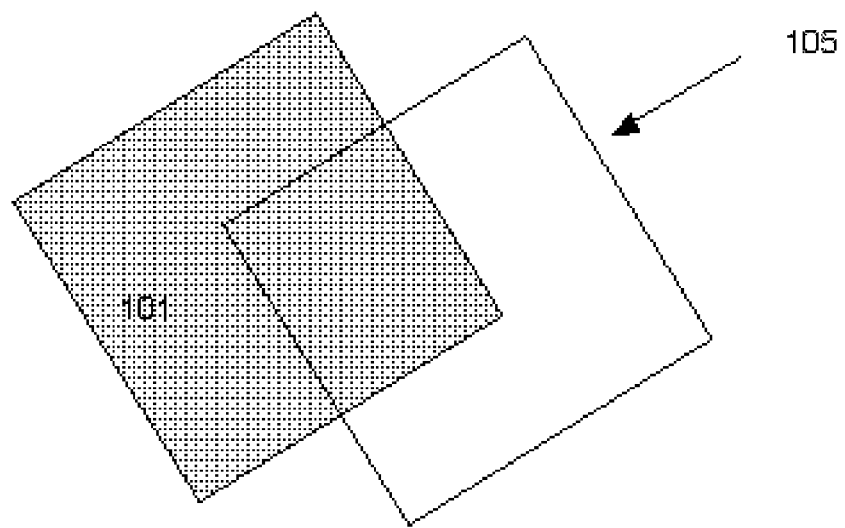

As in FIG. 1, solar cell arrays 101 are part of the PPTV smart structures. The solar cell arrays 101 are shown separately again in FIG. 2 with the protective transparent layer 105. For clarity the protective layer 105 is shown separately from 101. The solar cell arrays 101 not only convert sunlight into electricity but also converts heat energy into electricity using special semiconductor junctions integrated into this design of the thin layers materials.

Figure 3:

Electricity can be generated using the pressure, wind and vibrations generated by the vehicles running on the pavement using the same PPTV material structures. In FIG. 1 the piezo-electric component 102 is shown as an integrated component of the PPTV material structure. FIG. 3 presents the cross section of the layered PPTV structure showing the piezo-electric component 102. The piezo-electric component 102 is made up of novel ceramic material that acts as a substrate for the solar layer 101. Similar substrates are metallic for common solar arrays, whereas the PPTV uses a ceramic that not only acts as a substrate but also performs piezo-electric power generation. The design of the PPTV materials and their fabrication process is flexible to allow usage of single compound that has light, heat and pressure sensitive materials as a single layer with a common electrical connection. This fabrication process also allows embedding of light and heat sensitive layers in to one compact layer with pressure sensitive (Piezo-electric) as a substrate.

Figure 4:
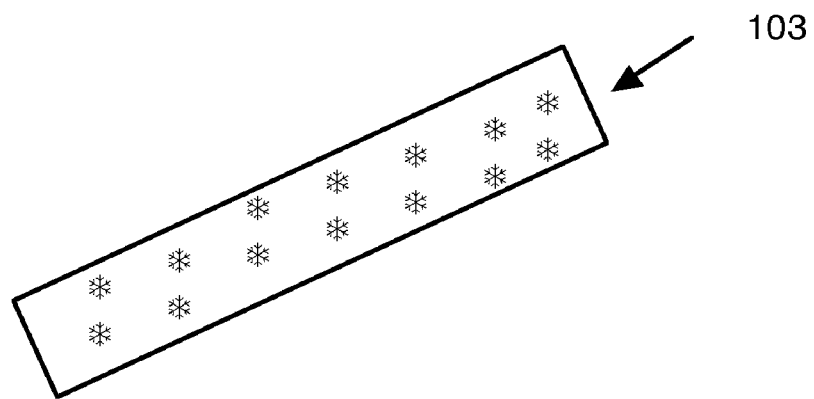

In an alternate embodiment, tire rotations of automobiles using the invention pavement will also used to generate electricity. This feature relies on tiny rotors 103 embedded on the on the surface layer of the invention, shown in FIG. 1. and in FIG. 4, a close-up of FIG. 1. These rotors 103 will rotate along with tires of the fast running vehicles and generate electricity via electromechanical methods. The presence of the rotors 103 will help reduce the friction between the vehicles' tires and the road surface and hence reduce the energy consumption by the vehicles. The strong wind or compressed air produced by moving vehicles will also rotate the tiny rotors 103 that are under vehicle bodies but not under their tires.

Figure 5:
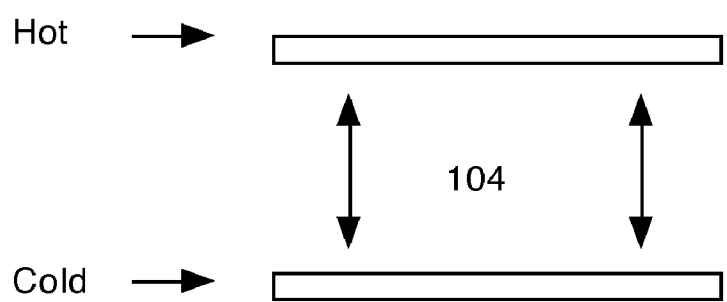

The heat generated by the sunlight absorbed on the road and nearby surfaces as well as the frictional forces from vehicle traffic creates hot road surfaces. A few inches below the road surface, the temperature is much lower than the surface temperature. This temperature difference between surface and subsurface can be used to generate electricity using the "thermo-electric effect". The thermo-electric power harvesting component 104 of the invention is shown in FIG. 1 and FIG. 5. Hot (labeled H) and cold (labeled C) surfaces are connected by the thermo-electric power harvesting junction 104. This additional power generation is most effective when temperature gradients are huge. This is different from the conversion heat directly into electricity using the same solar cell that converts light into energy. The thermo-electric effect needs temperature difference.

The present invention proposes using the use the existing electric grid alongside the road 109 in FIG. 5 with suitable changes to transport the electricity generated. The electricity generated will be stored using the common power grid. This offers an economically viable option for power generation and transportation and usage without making huge investments to lay a new smart grid until it is viable.

An alternate embodiment of the invention also proposes to build "energy storage and replacing stations" 108 with special batteries as shown in FIG. 1., alongside the highways and roadways using the invention to store the harvested electricity. These stored batteries will power the fully "battery-operated vehicles of the future" and enhance the driving distance of these vehicles. Plug-in vehicles can either exchange the batteries or charge the batteries at these stations.

The materials used by these PPTV structures include but not limited to, crystalline and/or amorphous silicon in different forms including deposits, mixture, thin and thick films. The materials used in PPTV structures include but not limited to semiconductors, metals, organic and inorganic plastics, polymers, composites and glass materials.

The materials used include but not limited to mono and multilayer ceramics, Cadmium telluride (CdTe), Cadmium sulfide (CdS), Copper Indium Gallium (di)Selenide (CIGS) cells, dye sensitized cells, organic cells which may be used as some parts of the PPTV building blocks in the design. These materials used include but not limited to recycled plastic, rubber and asphalt. These materials include photo-sensitive materials, photo and heat sensitive materials. These materials include photo, heat and pressure sensitive materials. These materials include amorphous, monocrystalline, multi-crystalline, semiconducting materials. The design and fabrication process uses thin and thick films, bulk structures, coatings of all materials. These include semiconducting materials and their multi-junctions. These materials require coatings, deposition and layer formation and sintering tools and processes for altering the properties and dimensions of these materials.

The invention can be made as small, portable sections of pavement that are designed to be easily laid, portable, interconnected, and integrated. Portable sections of the invention are designed to be mass produced and also designed to be laid as additional layers on the existing roads and pavements.

Figure 6:
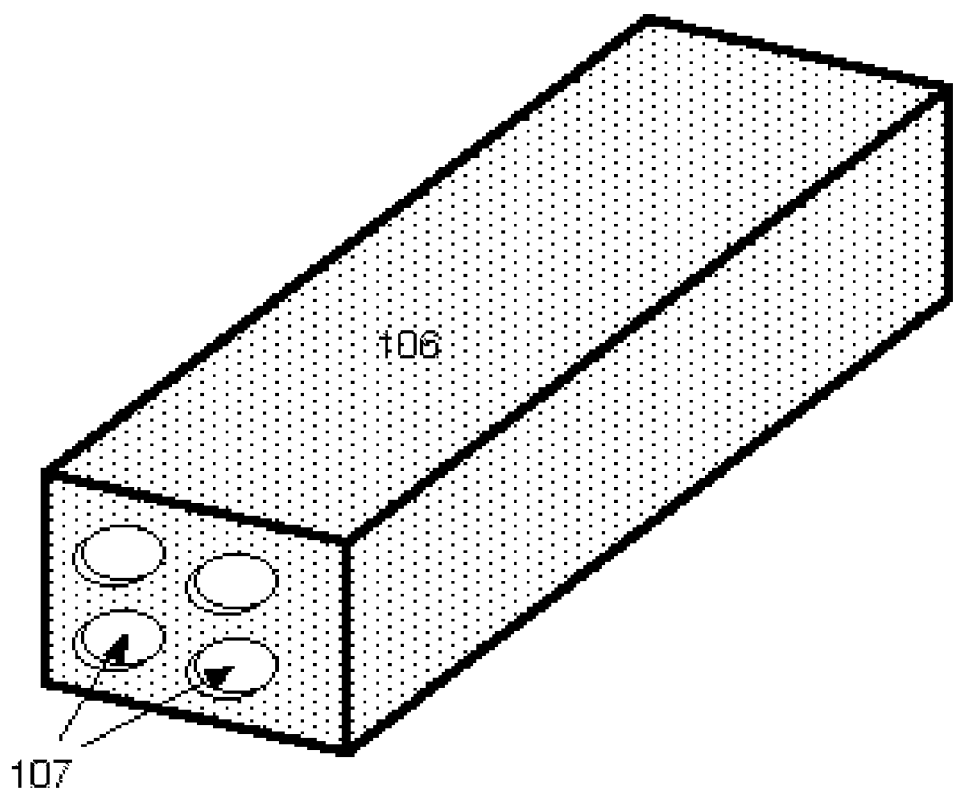

As in FIG. 6, the bottom layer will act as the connecting later for different portable segments of the invention. The interconnecting tubing 107 has all the cables and attachment option to the neighboring segments that hold each other tightly. The interconnecting tubing is designed to be big enough to run all the other cabling required for regular phone lines, fiber optic cables, digital data lines, electric power lines, monitoring and control networks, traffic and road monitoring devices.

It should be understood that the foregoing description of the invention is intended merely to be illustrative thereof and that other equivalents, embodiments and modifications of the invention may be apparent to those skilled in the art.

What is claimed is:

1. An integrated electric power generation system, the system comprised of a series of rectangular layers of material,
   a clear protective layer,
   a top layer immediately below said clear protective layer, comprised of parallel sections of solar cell array and sections comprised of tiny rotors, said solar cell array and tiny rotors connected electrically to an electric power collection means,
   a bottom layer comprised of piezo electric material, said piezo electric material connected electrically to said electric power collection means,
   the top layer and the bottom layer connected thermally via a thermoelectric power harvesting junction, said thermoelectric power harvesting junction connected electrically to said electric power collection means,
   said bottom layer also possessing a series of tubes and conduits running through its length to permit sections of the system to be connected to each other, said tubes and conduits large enough to carry electric cables and fiber-optic cables,
   the integrated electric power generation system disposed in the shape of a road, street, or highway.

2. An integrated electric power generation system as in claim 1 where the material of the top layer, solar cell array and the piezo electric material of the bottom layer are comprised of photo-piezo-thermo-voltaic (PPTV) materials.

3. An integrated electric power generation system as in claim 2 where the area comprised of tiny rotors is a pair of stripes along the length of the integrated electric power generation system that react to the passage of vehicles traveling along the length of the integrated electric power generation system.

4. An integrated electric power generation system as in claim 2 where the electric power collection means is a plurality of batteries placed alongside the integrated electric power generation system.

* * * * *